(12) United States Patent
Miki et al.

(10) Patent No.: US 7,585,690 B2
(45) Date of Patent: Sep. 8, 2009

(54) PROCESS FOR PRODUCING GROUP III NITRIDE COMPOUND SEMICONDUCTOR LIGHT EMITTING DEVICE, GROUP III NITRIDE COMPOUND SEMICONDUCTOR LIGHT EMITTING DEVICE AND LAMP

(75) Inventors: Hisayuki Miki, Chiba (JP); Kenzo Hanawa, Chiba (JP); Yasumasa Sasaki, Kamakura (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 11/944,306

(22) Filed: Nov. 21, 2007

(65) Prior Publication Data

US 2008/0116478 A1    May 22, 2008

(30) Foreign Application Priority Data

Nov. 22, 2006    (JP)    ............................. 2006-315497

(51) Int. Cl.
   *H01L 21/00*    (2006.01)
(52) U.S. Cl. ..................... 438/48; 438/604; 438/602; 438/22; 438/E21.108
(58) Field of Classification Search ......... 438/602–605, 438/48–52; 428/22–23
   See application file for complete search history.

(56) References Cited

U.S. PATENT DOCUMENTS

| 5,122,845 | A | 6/1992 | Manabe et al. |
| 5,290,393 | A | 3/1994 | Nakamura |
| 6,939,733 | B2* | 9/2005 | Shibata et al. ................. 438/48 |

FOREIGN PATENT DOCUMENTS

| JP | 4-297023 | 10/1992 |
| JP | 5-86646 | 12/1993 |
| JP | 3026087 | 1/2000 |
| JP | 2000-286202 | 10/2000 |
| JP | 2001-94150 | 4/2001 |
| JP | 3440873 | 6/2003 |
| JP | 3700492 | 7/2005 |

OTHER PUBLICATIONS

Kikuo Tominaga et al.; "AlN Film Preparation on Glass by Sputtering System with Facing Targets"; Japanese Journal of Applied Physics, vol. 28 (1989) Supplement 28-2; pp. 7-10.

(Continued)

*Primary Examiner*—Dung A. Le
(74) *Attorney, Agent, or Firm*—Sughrue Mion, PLLC

(57) ABSTRACT

A process for producing a group III nitride compound semiconductor light emitting device, the group III nitride compound semiconductor light emitting device and a lamp, having excellent producability and excellent light emitting characteristics are provided. Such a process for producing a group III nitride semiconductor light emitting device is a process for producing a group III nitride semiconductor light emitting device having a semiconductor layer 20 constituted by laminating an n-type semiconductor layer, a light-emitting layer 15 and a p-type semiconductor layer 16. Each of these consists of a group III nitride semiconductor, including a step of forming at least a part of the semiconductor layer 20 by a sputtering method, in which upon forming the p-type semiconductor layer 14 by a sputtering method, a Ga target containing Ga element, and a dopant target consisting of a mixture of an element having a small crystal composition of elements contained in the p-type semiconductor layer 14 and a dopant element is used as a sputtering target, and power is applied simultaneously to both the Ga target and the dopant target.

13 Claims, 5 Drawing Sheets

OTHER PUBLICATIONS

M. Ishihara, et al.; "Control of preferential orientation of AlN films prepared by the reactive sputtering method"; Thin Solid Films 316 (1998); pp. 152-157.

T. Kimuma et al.; "GaN films deposited by planar megnetron sputtering"; Vacuum 66 (2002), pp. 233-237.

Y. Ushiku et al., the $2^{nd}$ of the $21^{st}$ century alliance symposium memoirs (2003); pp. 295-298.

K. Nezu, et al.; "Growth of AlGaN single-crystalline layer by UHV sputtering method"; Japan Society of Applied Physics, No. 66, 7a-N-6 (2005), p. 248.

* cited by examiner

PROCESS FOR PRODUCING GROUP III NITRIDE COMPOUND SEMICONDUCTOR LIGHT EMITTING DEVICE, GROUP III NITRIDE COMPOUND SEMICONDUCTOR LIGHT EMITTING DEVICE AND LAMP

BACKGROUND OF THE INVENTION

1. Field of the Invention

The present invention relates to a group III nitride compound semiconductor light emitting device suitably used for a light emitting diode (LED), a laser diode (LD), an electronic device etc., and a group III nitride compound semiconductor light emitting device, and a lamp.

Priority is claimed on Japanese Patent Application No. 2006-315497, filed Nov. 22, 2007, the content of which is incorporated herein by reference.

2. Description of Related Art

Since a group III nitride semiconductor light emitting device has a band gap of a direct transition type of energy corresponding to a range from visible light to ultraviolet rays, and excels in luminous efficiency, a group III nitride semiconductor light emitting device is used as a light emitting device such as an LED or an LD.

In addition, in the case in which a group III nitride semiconductor is used for an electronic device, it provides electronic devices having characteristics superior to those derived from the conventional group III-V compound semiconductors.

Such a group III nitride compound semiconductor is, in general, produced from trimethyl gallium, trimethyl aluminum and ammonia as raw materials through a Metal-Organic Chemical Vapor Deposition (MOCVD) method. The MOCVD method is for growing a crystal by introducing a vapor of a raw material into a carrier gas to convey the vapor to the surface of a substrate and decomposing the raw material using a reaction with the heated substrate.

Hitherto, a single crystal wafer of a group III-V compound semiconductor is, in general, produced by growing a crystal onto a single crystal wafer of a different material. There is a large lattice mismatching between such a different kind of substrate and a group III nitride semiconductor crystal which grows epitaxially thereon. For example, in the case in which gallium nitride (GaN) was grown on a sapphire ($Al_2O_3$) substrate, there is a lattice mismatching of 16% therebetween, and in the case in which gallium nitride was grown on a SiC substrate, there is a lattice mismatching of 6% therebetween.

In general, there is a problem in that it is possible to grow a crystal epitaxially on a substrate when there is a lattice mismatching as in the above, and that it is impossible to provide a crystal having excellent crystallinity even if it is grown.

Thus, a method which includes laminating a layer which is called a low temperature buffer layer consisting of aluminum nitride (AlN) or aluminum nitride gallium (AlGaN) on a substrate, and then epitaxially growing a group III nitride semiconductor crystal thereon, as a method for epitaxially growing a group III nitride semiconductor crystal on a sapphire single crystal substrate or a SiC single crystal substrate has been disclosed and widely performed, as shown in, for example, Patent document 1 (Japanese Patent Publication No. 3,026,087) and Patent document 2 (Japanese Unexamined Patent Application, First Publication No. 4-297023).

In addition, a method which is called an Facing-Target cathode of facing a target to another target, for forming an AlN layer has been proposed in, for example, a Non-patent Document 1 (Kikuo Tominaga et al., "Japanese Journal of Applied Of Physics", Vol. 28, p7 (1989)).

In addition, a method for forming an AlN layer on a substrate using a DC magnetron sputtering method has been proposed in, for example, Non-patent Document 2 (M Ishihara et al., "Thin Solid Film)", vol. 316, p152 (1998))).

In addition, as a method which includes forming an AlN layer as a barrier layer by a method other than the MOCVD method, and forming another layer thereon by a MOCVD method, a method which includes forming a buffer layer using a high frequency sputtering, and growing a crystal having the same composition using a MOCVD method thereon has been proposed in for example Patent Document 3 (Japanese Examined Application, Second Publication No. 5-86646).

However, there is a problem in that an excellent crystal cannot be stably produced by the method disclosed in Patent Document 3.

Thus, in order to stably produce an excellent crystal, for example, a method which includes annealing in a mixed gas consisting of an ammonia and hydrogen after a buffer layer is grown has been proposed in for example Patent Document 4 (Japanese Patent Publication No. 3440873), and a method for forming a buffer layer by using a DC sputtering at a temperature of not less than 400° C. has been proposed in for example Patent document 5 (Japanese Patent Publication No. 3700492).

However, since the methods disclosed in Patent Documents 4 and 5 form a buffer layer by a sputtering method, the resultant buffer layer may have poor crystallinity in terms of the conditions necessary for forming a layer, although the rate of forming layer is high. When a GaN layer is grown up onto a buffer layer with such a low crystallinity by MOCVD method, there is possibility that the crystallinity of GaN layer significantly deteriorates.

On the other hand, research has been conducted on producing a group III nitride compound semiconductor crystal by sputtering. A method of forming a GaN layer onto a (100) face of Si and a (0001) face of $Al_2O_3$ by high frequency magnetron sputtering using $N_2$ gas has been proposed in, for example, Non-patent Document 3 (Y. USHIKU et al., "the 21st century alliance symposium memoirs", Vol. 2nd, p295 (2003)).

In addition, a method for forming a GaN layer using an apparatus in which a cathode faces a solid target and a mesh which is inserted between a substrate and the target has been proposed in for example Non-patent Document 4 (T. Kikuma et al., "Vacuum", Vol. 66, P233 (2002)).

In addition, when a GaN layer consisting of a group III nitride compound semiconductor crystal in the above is formed, for example, it is necessary to layer a crystal in which dopant elements such as Si or Mg have been doped.

In such a case, a target in which dopant is mixed into a Ga metal which serves as a mother material, and a GaN layer is formed by a sputtering method, as shown in for example Non-patent Document 5 (Japan Society of Applied Physics "No. 66 Japan Society of Applied Physics" pamphlet, 7a-N-6 (autumn, 2005), p248)).

However, there is a problem in that it is difficult to minutely adjust the doping ratio when dopant is mixed with a Ga metal by the method disclosed in Non-patent document 5.

In addition, there is a problem in that it is difficult for Mg to enter when Al composition is high, since in the case in which an AlGaN using Mg dope as a group III nitride layer is layered, the amount of Mg taken into a crystal corresponding to Al composition, although Mg will easily enter when Al composition is low.

In addition, there is a problem in that the apparatus becomes complex and the processing time is long. Another problem is that the yield to the target amount deteriorates, when Ga is mixed with a dopant element in the sputtering apparatus using the method disclosed in Non-patent Document 5.

For these reasons, a method has been requested for stably forming a GaN layer with excellent crystallinity at a high efficiency, being capable of optimizing the composition of the target material which includes Ga and the mixing balance of dopant concentration, using an apparatus having a simple constitution.

The present invention was made in view of the above problems, and it is an object of the present invention to provide a process for producing a group III nitride compound semiconductor light emitting device, the group III nitride compound semiconductor light emitting device and a lamp, the process being capable of mixing Ga serving as a mother material, a mixed crystal and a dopant element at a proper balance, and forming a stable crystal film consisting of a group III nitride compound semiconductor with excellent uniformity at a high efficiency for a short period using an apparatus having a simple constitution, excellent productivity and excellent light emitting characteristics.

SUMMARY OF THE INVENTION

As a result of thorough research conducted by the inventors of the present invention in order to solve the above problems, it has been discovered that it is possible to reproducibly realize the optimal balance between the mixed crystal composition and the dopant concentration by sputtering a mixed target consisting of elements serving as a sub-composition of a mixed crystal and a target of Ga serving as a main-composition of a mixed crystal, through simultaneous discharging. The present invention was completed from the above results.

The present invention relates to the following.

[1] A process for producing a group III nitride semiconductor light emitting device having a semiconductor layer constituted by laminating an n-type semiconductor layer, a light-emitting layer and a p-type semiconductor layer, each of which consisting of a group III nitride semiconductor, including a step of forming at least a part of the semiconductor layer by a sputtering method, in which upon forming the p-type semiconductor layer by a sputtering method, a Ga target containing Ga element, and a dopant target consisting of a mixture of an element having a small crystal composition of elements contained in the p-type semiconductor layer and a dopant element is used as a sputtering target, and power is applied simultaneously to both the Ga target and the dopant target.

[2] The process for producing a group m nitride semiconductor light emitting device as set forth in [1], in which the dopant element is Mg, and the element having a small crystal composition is Al.

[3] The process for producing a group III nitride semiconductor light emitting device as set forth in [1] or [2], in which the power applied to the target upon forming the p-type semiconductor layer is applied by a high frequency method or a pulse DC method.

[4] The process for producing a group III nitride semiconductor light emitting device as set forth in any one of [1] to [3], in which upon forming the p-type semiconductor layer, a magnetic field is rotated or swung to the sputtering target.

[5] The process for producing a group III nitride semiconductor light emitting device as set forth in any one of [1] to [4], in which the forming of the p-type semiconductor layer is performed by a reactive sputtering method of circulating a nitride raw material in a reactor.

[6] The process for producing a group III nitride semiconductor light emitting device as set forth in [5], in which the nitride raw material is nitrogen.

[7] The process for producing a group III nitride semiconductor light emitting device as set forth in any one of [1] to [6], in which the semiconductor layer is formed on a buffer layer which is formed on a substrate before the semiconductor layer is formed.

[8] The process for producing a group m nitride semiconductor light emitting device as set forth in [7], in which the buffer layer consists of a group III nitride compound containing Al as a group III element.

[9] The process for producing a group III nitride semiconductor light emitting device as set forth in [8], in which the buffer layer consists of AlN.

[10] The process for producing a group III nitride semiconductor light emitting device as set forth in any one of [7] to [10], in which the buffer layer is formed so as to cover at least 90% of the surface of the substrate.

[11] The process for producing a group III nitride semiconductor fight emitting device as set forth in any one of [7] to [10], in which the columnar crystal constituting the buffer layer has a grain ranging from 0.1 to 100 nm.

[12] The process for producing a group III nitride semiconductor light emitting device as set forth in any one of [7] to [11], in which the buffer layer has a thickness ranging from 10 to 500 nm.

[13] The process for producing a group III nitride semiconductor light emitting device as set forth in any one of [7] to [12], in which the substrate consists of sapphire.

[14] A group III nitride semiconductor light emitting device obtained by the process as set forth in any one of [1] to [13].

[15] A lamp using the group III nitride compound semiconductor light emitting device as set forth in [11].

DETAILED DESCRIPTION OF THE INVENTION

Figure 1:
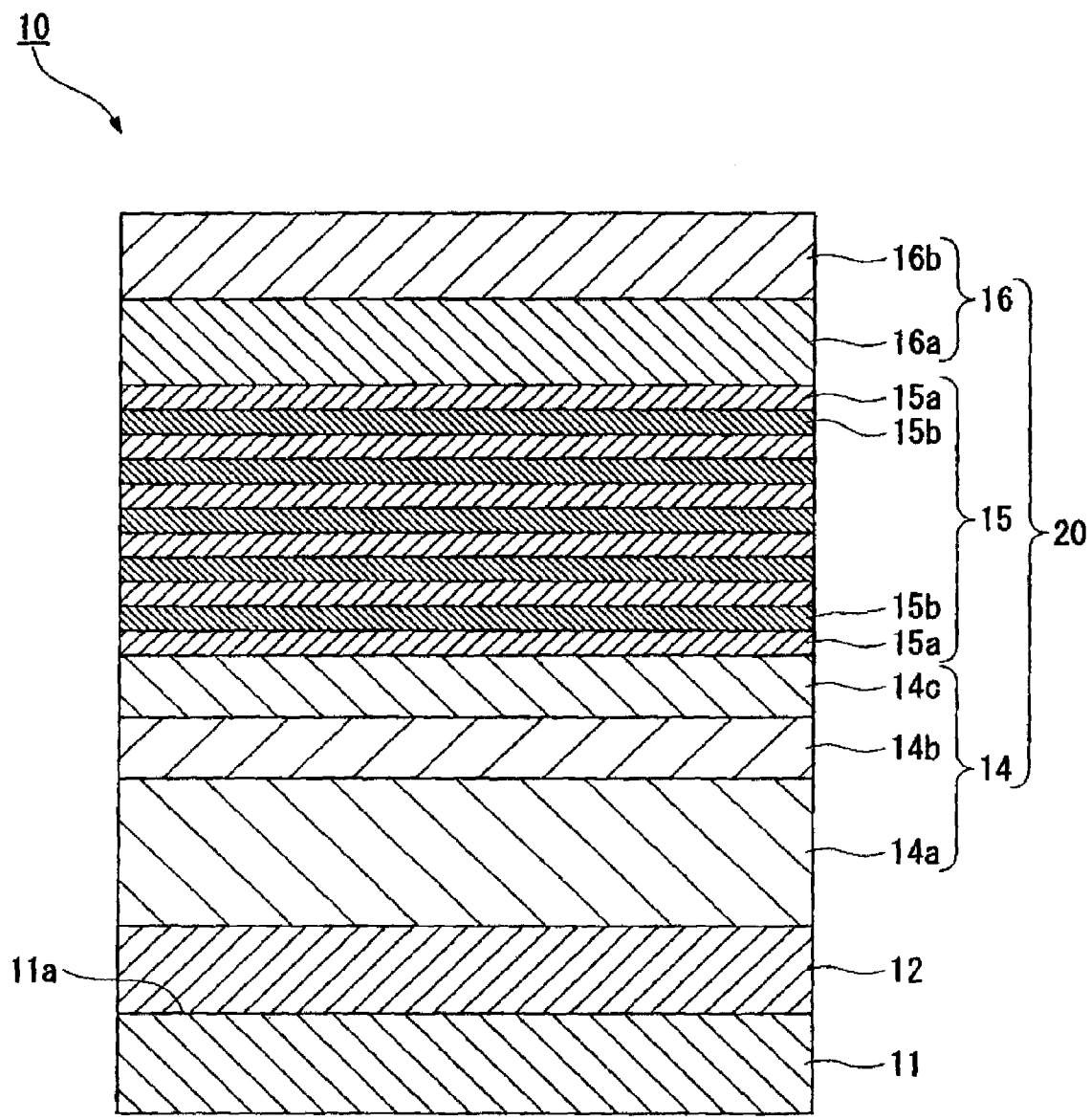
FIG. 1 shows an example of a group III nitride compound semiconductor light emitting device of the present invention, i.e. a schematic view showing the sectional structure of a laminated semiconductor.

An explanation will be given below with respect to an embodiment of a process for producing a group III nitride compound semiconductor light emitting device of the present invention, the group III nitride compound semiconductor light emitting device and a lamp, referring to FIGS. 1 to 5 appropriately.

The process for producing a group III nitride compound semiconductor light emitting device (it may be referred to a light emitting device, below) of this embodiment is a process for producing a group III nitride semiconductor light emitting device having a semiconductor layer 20 constituted by laminating an n-type semiconductor layer 14, a light-emitting layer 15 and a p-type semiconductor layer 16, each of which consisting of a group III nitride semiconductor, including a step of forming at least part of the semiconductor layer 20 by a sputtering method, in which upon forming the p-type semiconductor layer 16 by the sputtering method, a Ga target (cf. Ga target 47a in FIG. 5) containing Ga element, and a dopant target (cf. AlMg target 47b in FIG. 5) consisting of a mixture of dopant element and an element having a small crystal composition of elements contained in the p-type semiconductor layer is used as a sputtering target, and power is applied simultaneously to both the Ga target and the dopant target.

Figure 5:
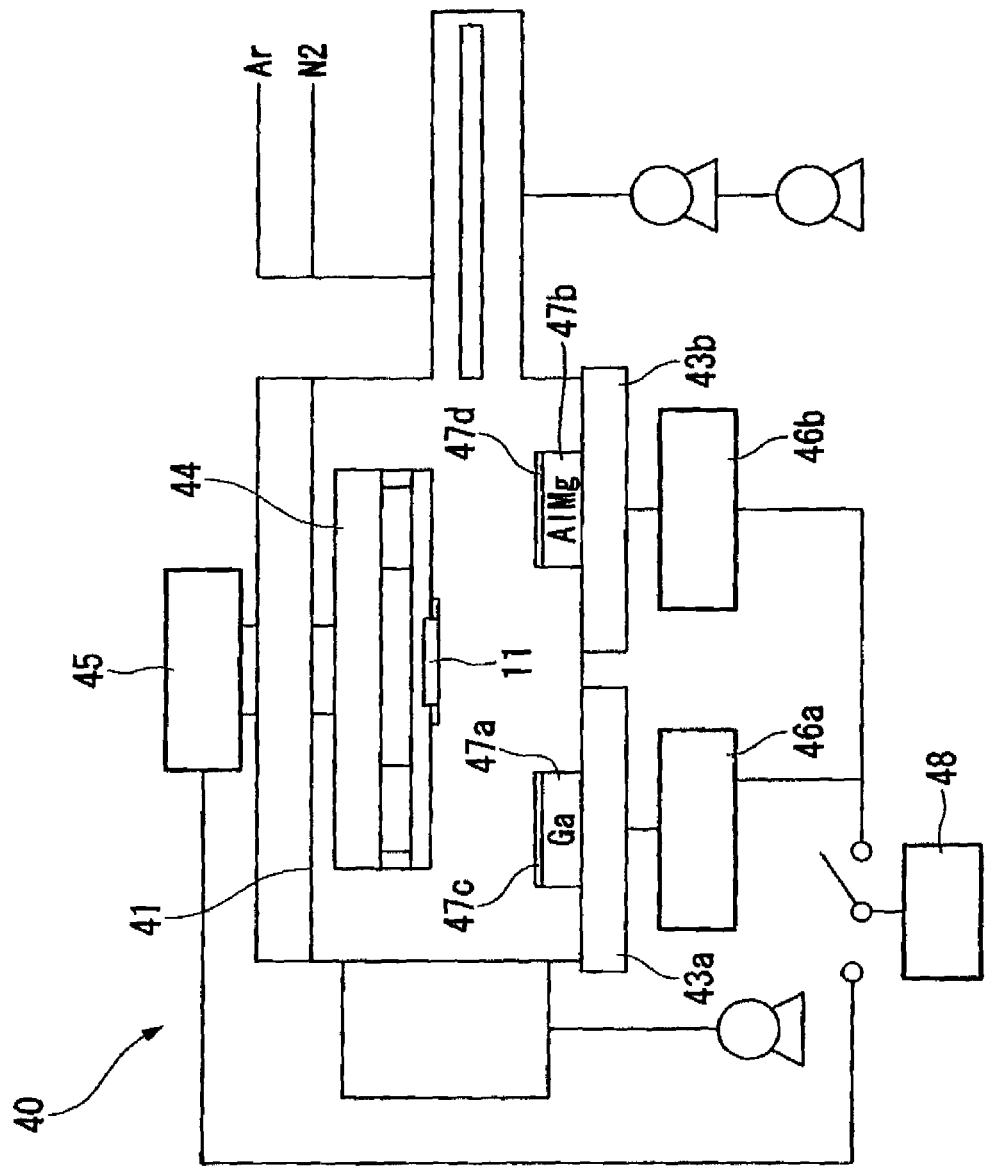
FIG. 5 shows an example of a process for producing a group III nitride compound semiconductor light emitting device of the present invention, i.e. a schematic view showing a structure of the sputtering apparatus having a Ga target and an AlMg target installed in a chamber thereof.

In the process for producing of this embodiment, as shown in a sputtering apparatus 40 of an example shown in FIG. 5, a Ga target 47a, an AlMg target 47b (a dopant target) in which a dopant element is Mg, and the element having a small crystal composition is Al are used as sputtering targets. By applying power simultaneously to both the Ga target 47a and the AlMg target 47b, a process for forming the P-type semiconductor layer 16 on the light emitting layer 15, the details of which will be described later, is provided.

An explanation will be given with respect to a laminated structure of a light emitting device produced by the production process of this embodiment, using the laminated semiconductor 10 shown in FIG. 1. This laminated semiconductor 10 is constituted from a substrate 11, a buffer layer 12 consisting of a group III nitride compound laminated on the substrate 11, and a semiconductor layer 20 formed on the buffer layer 12, and each of the n-type semiconductor layer 14, the light emitting layer 15 and p-type semiconductor layer 16 are laminated successively in the semiconductor layer 20.

Figure 2:
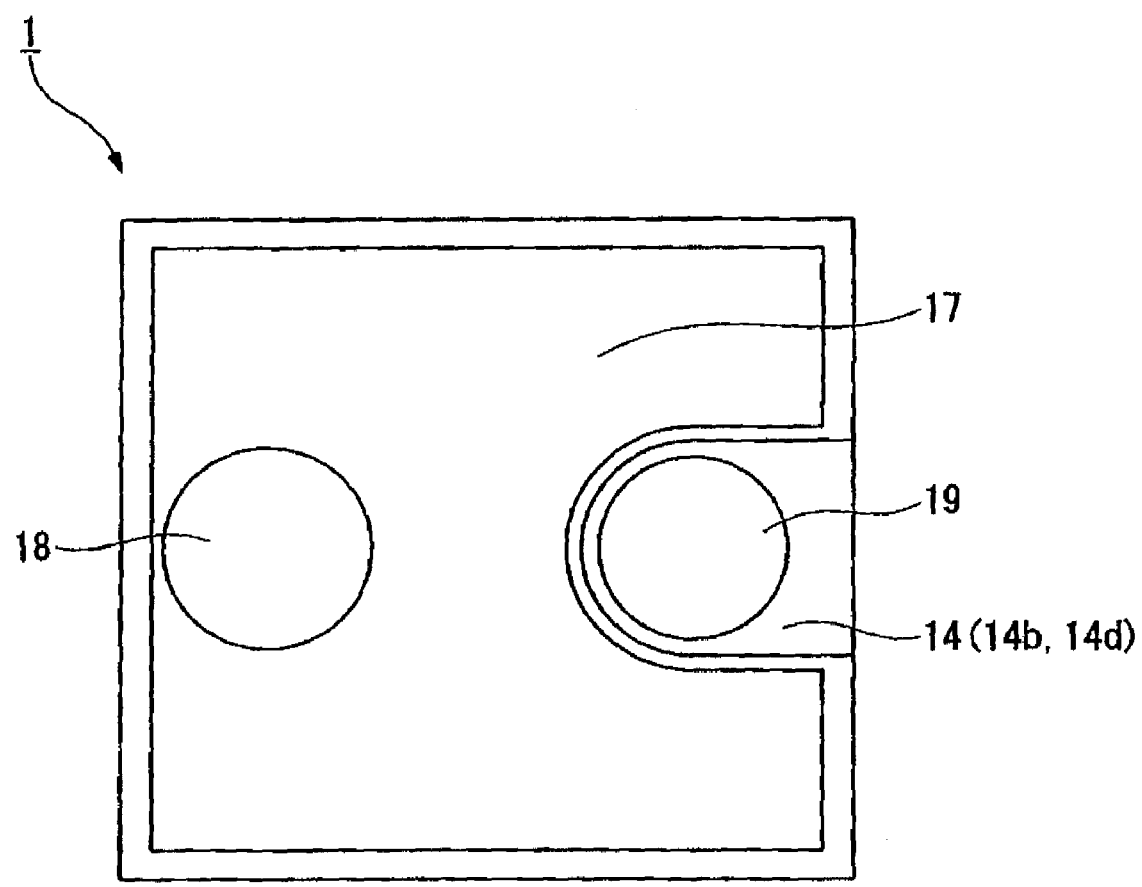
FIG. 2 shows an example of a group III nitride compound semiconductor light emitting device of the present invention, i.e. a schematic view showing a planer structure.
Figure 3:
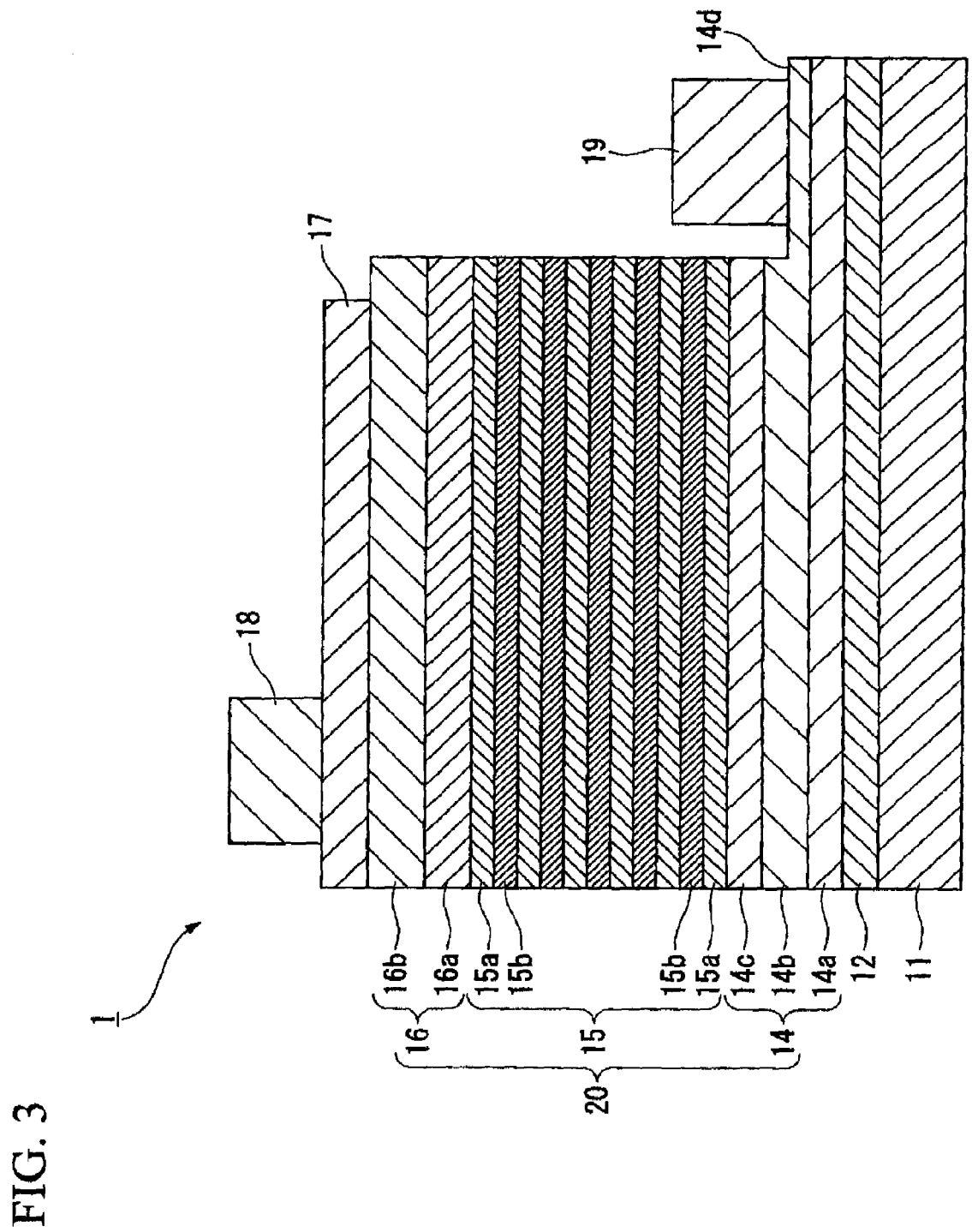
FIG. 3 shows an example of a group III nitride compound semiconductor light emitting device of the present invention, i.e. a schematic view showing a sectional structure.

As shown in FIGS. 2 and 3, the laminated semiconductor 10 of this embodiment can provide a light emitting device 1 in which a transparent positive electrode 17 is laminated on the p-type semiconductor layer 16, a positive electrode bonding pad 18 is formed thereon, and a negative electrode 19 is laminated onto an exposed domain 14d formed in an n-type contact layer 14b of the n-type semiconductor layer 14.

An explanation will be given in detail below, with respect to a production process and a light emitting device of this embodiment

[Formation of a Semiconductor Layer by Sputtering a Plurality of Sputtering Targets]

As described in the above, in the production process of this embodiment, upon forming a semiconductor layer by a sputtering method, a power is simultaneously applied to both a Ga sputter target 47a and an AlMg target 47b, using the Ga sputter target 47a and the AlMg target 47b disposed in a chamber 41 shown in FIG. 5. In addition, in the semiconductor layer 20 of this embodiment shown in FIG. 1, each of a p-type clad layer 16a and a p-type contact layer 16b which constitute the p-type semiconductor layer 16 is formed by the sputtering method described in the above.

The inventors of the present invention have thoroughly conducted experiments and research, and as a result, they found that it is possible to control the reproducibly a mixed crystal composition and dopant concentration by sputtering both a target (Ga target 47a) of Ga being a main composition of a mixed crystal and a dopant target (AlMg target) in which an element (Al in this embodiment) being a sub-composition of a mixed crystal and a dopant element (Mg in this embodiment) are mixed, using a simultaneous discharging.

An explanation will be given in detail below with respect to a method for forming a semiconductor layer by sputtering a plurality of sputtering targets in this embodiment, referring to a sputtering apparatus 40 shown in FIG. 5.

In the sputtering apparatus 40 of this embodiment, each of the Ga target 47a consisting of a Ga element and the AlMg target 47b, in which Al being a sub-composition of the semiconductor layer and Mg being a dopant element, is placed on the electrodes 43a and 43b in a chamber 41.

In addition, the electrodes 43a and 43b are connected to matching boxes 46a and 46b, respectively. A substrate 11 is installed to a heater base 44, and a matching box 45 is connected to heater base 44. Each of the Matching boxes 46a, 46b and 45 is connected to a power supply 48, such that an electric current is supplied to the electrodes 47a and 47b through the matching boxes 46a and 46b, and an electric current is supplied to the heater base 44 through the matching box 45. In this way, power is applied to the Ga target 47a and the AlMg target 47b, whereas a bias is applied to the substrate 11.

The matching boxes 46a, 46b and 45 are disposed in order to get a matching of impedance between the inside of the sputtering apparatus 40 and a high frequency power supply 48.

When forming a semiconductor layer onto the substrate 11 using the sputtering apparatus, at first, for example, Ar gas and nitrogen gas are supplied to the chamber 41. The heater base 44 is heated by a heating means (not shown in the drawing) disposed in the heater base 44 to heat the substrate 11 at a predetermined temperature, that is, a growing temperature of each layer grown on the substrate 11.

An electric current is supplied to each of the electrodes 43a and 43b while heating the substrate 11, power is applied to each of the Ga target 47a and the AlMg target 47b simultaneously, and an electric current is supplied to the heater base 44, thereby applying a bias to the substrate 11.

At this time, both the Ga target 47a consisting of Ga and the AlMg target 47b consisting of Al—Mg are exposed to Ar gas and plasma of nitrogen gas, thereby emitting particles of Ga from the Ga target 47a and particles of Al—Mg from the AlMg target 47b from the AlMg target 47b simultaneously. A semiconductor layer is formed onto the substrate 11 by supplying these particles so as to hit to the substrate 11 or the surface of the film laminated onto the substrate 11.

In this embodiment, the power to be applied to the Ga target 47a and the AlMg target 47b preferably ranges from 0.1 W/cm$^2$ to 100 W/cm$^2$, more preferably ranges from 1 W/cm$^2$ to 50 W/cm$^2$, and the most preferably ranges from 1.5 W/cm$^2$ to 50 W/cm$^2$.

By setting the power to be applied to the Ga target 47a and the AlMg target 47b to be within the above range, species having a large amount of power can be generated and this reaction seed can be supplied to the substrate 11 with a high kinetic energy to activate migration on the substrate 11, thereby easily looping the dislocation.

The inventors of the present invention have thoroughly conducted research and experiments, and as a result they have found that the relation between the mixing ratio of each element in each sputtering target and the composition or doping ratio of the film formed is univocal. They also found that the relationship between the power ratio to each sputtering target and the composition or doping ratio of the film formed is univocal in the production process in this embodiment.

Specifically, in general, a p-type semiconductor layer of a light emitting device such as an LED contains a Mg dope AlGaN having an Mg dope amount of approximately 0.1% and an Al composition of approximately 7%. In this case, the AlMg target 47b consisting of Al—Mg may be formed so as to have a Mg:Al ratio of approximately 1:70. In addition, a p-type semiconductor layer of a light emitting device contains a Mg dope AlGaN having a Mg dope amount of approximately 0.1% and an Al composition of approximately 2%. In this case, the AlMg target 47b consisting of Al—Mg may be formed so as to have an Mg:Al ratio of approximately 1:20.

In addition, it is also possible to adjust the composition or doping ratio of the semiconductor layer to be formed by appropriately setting the size ratio of each sputtering target, the ratio of power to be applied to each sputtering target, on/off time ratio, etc.

As a sputtering method to be used in the production process in this embodiment, an RF (high frequency) sputtering method, or a DC sputtering method can be used to apply power to the sputtering target.

In addition, when a reactive sputtering method which will be described later is used, an RF sputtering method is preferably used because it is easy to control the film forming rate thereby.

In addition, when a reactive sputtering method is used in a DC sputtering method, if an electric field is taken continuously by a DC, then the sputtering target will be charge-up to make it difficult to increase film-forming rate, and hence it is preferable to use a pulse-type DC sputtering method which gives bias as pulse.

In addition, when a semiconductor layer is formed by a sputtering method, it is preferable to form the semiconductor layer by a reactive sputtering method of circulating a nitride raw material within a reactor, because it is possible to maintain excellent crystallinity excellent by controlling the reaction, and to stably reproduce the excellent crystallinity.

In addition, when forming a semiconductor layer using a sputtering method, it is preferable to rotate or swing the magnetic field to a sputtering target.

In particular, when an RF sputtering method is used, it is preferable to form a layer by moving a position of a magnet within a target (sputtering target) as a method for obtaining a uniform thickness. Specifically, the motion of the magnet can be appropriately selected depending on the type of a sputtering apparatus, for example, a magnet may be either swung or rotated.

It should be noted that the pressure in the chamber 41 when forming a semiconductor layer by a sputtering method is preferably not less than 0.3 Pa If the pressure in the chamber 41 is less than 0.3 Pa, then the amount of nitrogen becomes too low, and as a result, there is a possibility that sputtered metal which has not yet been a nitride will be deposited onto the substrate. In addition, the upper limit of the pressure in the chamber 41 is not particularly limited; however, it is necessary to control the pressure to a degree capable of generating plasma.

As nitride raw materials to be used in this embodiment, any raw material generally known can be used without limitation. However, ammonia and nitrogen ($N_2$) are preferable, because they are easily handled, comparatively inexpensive and easily available.

Although ammonia excels in decomposition efficiency and can form a layer at a high growth rate, deharmanising equipment and a gas detector are necessary because of high reactivity and poisonous characteristics, and it is necessary to use chemically stable material as a material for the member used in a reacting apparatus.

In addition, when nitrogen ($N_2$) is used as a raw material, a simple apparatus can be used, however, high reacting rate cannot be obtained. Nevertheless, nitrogen ($N_2$) is the most preferable nitrogen source in view of trade-offs with a cost of an apparatus, because it is possible to obtain a film-forming rate which can be industrially available, although which is inferior to ammonia, if nitrogen ($N_2$) is introduced into an apparatus after nitrogen ($N_2$) is decomposed by an electric field or a heat.

The film-forming rate when forming a semiconductor layer by a sputtering method preferably ranges from 0.01 nm/s to 10 nm/s. If the film-forming rate is less than 0.01 nm/s, then the film-forming process time increases causing an industrial production loss. On the other hand, if the film-forming rate is more than 10 nm/s, then it becomes difficult to provide an excellent layer.

The substrate 11 can be subjected to a pre-treatment using a sputtering method, after the substrate 11 is introduced into the chamber 41 of the sputtering apparatus 40 and before forming a buffer layer 12. Specifically, the surface can be coordinated by exposing the substrate 11 to a plasma of Ar or $N_2$. For example, by actuating a plasma such as Ar gas or $N_2$ gas onto the surface of the substrate 11, organic materials and oxides adhered to the substrate 11 can be removed. In this case, if electrical voltage is applied between the substrate 11 and the chamber, then plasma particles will act efficiently on the substrate.

In addition, it is preferable to perform a wet-type pretreatment in the substrate 11 used in this embodiment. For example, the film-forming process can be stabilized by performing hydrogen-termination using a well known RCA washing method on the surface of the substrate 11 consisting of a silicon.

The inventors of the present invention have conducted thorough research and examinations, and as a result, they have found that the temperature of the substrate 11 when forming a semiconductor layer ranges preferably from room temperature to 1200° C., more preferably from 300 to 1000° C., and most preferably from 500 to 800° C.

If the temperature of the substrate 11 is less than the lower limit above, then a migration on the substrate is suppressed, and as a result, it is not possible to form a group III nitride compound semiconductor crystal having an excellent crystallinity. On the other hand, if the temperature of the substrate 11 is more than the upper limit in the above, then a group III nitride compound semiconductor crystal may be decomposed.

It should be noted that the room temperature explained in the present invention specifically ranges from 0 to 30° C., although it is affected by an environment of process.

In the production process of this embodiment, as described in the above, when performing an epitaxial growth of a semiconductor layer consisting of a group III nitride compound semiconductor crystal using a sputtering method, power is simultaneously applied to both a Ga target 47a consisting of Ga element serving as a main component, and an AlMg target 47b in which Al serving as a sub-component of a semiconductor layer and Mg serving as a dopant element are mixed. By this, doping a semiconductor layer can be performed easily, and the adjustment of doping amount can be easily performed Hence, it is possible to sputter under a condition that the mixing balance of the composition of target material containing Ga and a dopant is optimized. Thereby a semiconductor layer consisting of a group III nitride compound semiconductor with excellent uniformity can be formed at a high efficiency.

It should be noted that it is explained referring to the sputtering apparatus which is equipped with two kinds of sputtering targets (the Ga target 47a and the AlMg target 47b)

within the chamber 41 in this embodiment; however, the production process of the present invention is not limited to this. For example, in the case in which several kinds of film having different compositions are formed, it becomes possible to form and laminate a plurality of films having a specific composition respectively onto the substrate in the same chamber by further disposing a plurality of targets further within the chamber.

If a sputtering apparatus is supposed to have such a constitution, then it is possible to simplify a production apparatus and shorten the processing period, thereby it becomes possible to form a film at a high efficiency using a sputtering method.

In addition, this embodiment is explaining using the AlMg target 47b consisting of Al—Mg, serving as a dopant target; however, this is not restrictive, a dopant target consisting of various of elements in combination can be used in a process for producing a light emitting device consisting of a GaN type semiconductor. For example, a dopant target can be used consisting of In—Si in which Si serves as a dopant element and In serves as the element having a small crystal composition in a semiconductor layer. In addition, a dopant target consisting of Al—Si or In—Mg can be also used.

In addition, in a process for producing a light-emitting device of this embodiment, for example, it is also possible to sputter the Ga target 47a and/or AlMg target 47b in a liquefied state to form a layer. In addition, by sputtering the Ga target 47a and the AlMg target 47b in the state in which at least the surface layer of 47c and 47d are liquefied, it is possible to take particles having high energy of each sputtering target and supply the particles onto the substrate 11, and to use the Ga target 47a and the AlMg target 47b uniformly without partially leaning over. By this, it becomes possible to grow a semiconductor layer consisting of a group III nitride semiconductor having excellent crystallinity, at a higher efficiency.

In addition, as described in the above, when a liquefied target is used, there is a possibility that the film-forming treatment using a sputtering method may be affected as a result that gaseous components incorporated into Ga such as oxygen and nitrogen are emitted into the chamber 41 during the sputtering. In order to avoid such an influence of gaseous components to the sputtering treatment, it is preferable to perform a pretreatment on the sputtering target 47 when disposing the sputtering target 47 within the chamber 41 to accelerate de-gassing.

As a pretreatment to be performed on the sputtering target 47, for example, heating of the sputtering target 47 to emit gaseous components into a gaseous phase can be used. In addition, it is also possible to remove impurities by reducing metal, i.e. by circulating hydrogen gas within a gaseous phase in the chamber 41.

In addition, in the production process of this embodiment, a sputtering target consisting of Ga can be liquefied by applying power to the sputtering target to generate plasma; thereby, elevating the temperature of the sputtering target.

In addition, the temperature of the sputtering target 47 is elevated by the heat generated when heating the substrate 11. At that time, if the sputtering target 47a can be heated to no less than 29° C., then the sputtering target 47a can be liquefied even when the power to be applied to the sputtering target 47a is less than the above range. When the temperature does not reach the liquefying temperature, a heating means for heating a sputtering target which is not shown in the drawings may be disposed in the chamber 41. The heating means used in this case is not particularly limited, an electrical heater, etc. may be appropriately selected and used.

In general, the material to be used for forming the layer is selected to laminate a layer consisting of a plurality of materials on a substrate using a sputtering method, and thereafter a chamber for exclusive use therefor is designed. Then, a sputtering apparatus equipped with a plurality of chambers is used, and the substrate is moved among the chambers to form a layer. In such a constitution, there is a possibility that a sputtering apparatus used in the production becomes a large scale; however, in this embodiment, it is possible to significantly simplify the production apparatus by disposing a plurality of sputtering targets in a chamber and simultaneously applying power thereto.

[Laminated Structure of a Light Emitting Device]

A detailed explanation will be given below with respect to a constitution of a light emitting device 1 obtained by the production process of this embodiment, which uses, a Ga target and an AlMg target disposed in a chamber and applies power to both these Ga target and the AlMg target simultaneously to form a semiconductor layer consisting of a group III nitride compound semiconductor which contains Ga as a group III element, on the substrate 11.

[Substrate]

As a material which can be used for the substrate 11 in this embodiment, various materials can be selected and used without being particularly limited, as long as it is a material for a substrate being capable of epitaxially growing a group III nitride compound semiconductor crystal onto the surface. For example, sapphire, SiC, silicon, zinc oxide, magnesium oxide, manganese oxide, zirconium oxide, manganese oxide zinc iron, magnesium oxide aluminum, zirconium borate, gallium oxide, indium oxide, lithium oxide gallium, lithium oxide aluminum, neodymium oxide gallium, lantern oxide strontium aluminum tantalum, strontium oxide titanium, titanium oxide, hafnium, tungsten, molybdenum, etc. are exemplary.

It should be noted that the use of an oxide substrate or a metal substrate is effective for avoiding chemical decomposition of the substrate because a buffer layer of which detail will be described later acts as a coat layer, when using an oxide substrate or a metal substrate. This is known to cause a chemical decomposition by contact with ammonia at a high temperature, and by forming a buffer layer without using ammonia and forming a ground layer which constitutes an n-type semiconductor layer using ammonia.

In addition, in general, the temperature of a substrate can be controlled so as to be low in a sputtering method. Hence, each layer can be formed on the substrate without damaging the substrate 11, even when using a substrate consisting of a material which is decomposed at high temperature.

<Buffer Layer>

The laminated semiconductor 10 in this embodiment consists of the substrate 11 and the buffer layer 12 consisting of a group III nitride compound laminated on the substrate 11. The buffer layer 12 is formed in order to protect the substrate 11 from a chemical reaction at a high temperature, to moderate the difference in lattice constant between the material of the substrate 11 and a semiconductor layer 20, or to promote nucleus generation for crystal growth.

The buffer layer 12 is formed preferably so as to cover at least 60% or more of the surface 11a of the substrate 11, and most preferably so as to cover 100%, i.e. to cover the surface 11a of the substrate 11 leaving no spaces. If the domain where the buffer layer 12 covers the surface 11a of the substrate 11 decreases, then the substrate 11 is largely exposed, thereby causing hillocks and bits in the semiconductor layer which are formed on the buffer layer.

In addition, the buffer layer 12 may be formed so as to cover the side face in addition to the surface 11*a* of the substrate 11, and further, may be formed so as to cover the back surface of the substrate 11.

The buffer layer 12 preferably consists of a columnar crystalline aggregate in view of the buffering function, and the average value of the width of grain of the columnar crystalline aggregate preferably ranges from 0.1 to 100 nm, in view of the buffering function, and more preferably ranges from 1 to 70 nm.

A crystal of a group III nitride compound semiconductor has a hexagonal crystal structure, and is likely to form a texture on the basis of a hexagonal column. In particular, a film formed by a method using a metal material in a plasma state is likely to form a columnar crystal. When forming a buffer layer 12 consisting of a columnar crystal onto the substrate 11, since the buffering function of the buffer layer 12 acts effectively, the group III nitride compound semiconductor formed thereon becomes a crystalline film having excellent crystallinity.

It should be noted that the columnar crystal referred to in the present invention means a crystal which forms a grain boundary between adjacent crystal grains to be isolated and is formed to be cylindrical as a longitudinal cross-sectional shape.

In addition, the width of grain in the above means a distance between a crystal boundary and another crystal boundary when the buffer layer 12 is an aggregate of a columnar grain. On the other hand, the width of grain means the length of the longest total length of the surface where a crystal grain comes into contact with the surface of the substrate when gains are interspersed as islands.

Thickness of the buffer layer 12 ranges preferably from 10 to 500 nm, more preferably from 20 to 100 nm.

If the thickness of the buffer layer 12 is less than 10 nm, then the above mentioned buffer function becomes insufficient. In addition, if the thickness of the buffer layer 12 is more than 500 nm, then it takes a longer amount of time to form a layer despite the buffer function as a buffer layer has no changes; thereby, productivity may deteriorate.

As a material for constituting the buffer layer 12, any material can be used, as long as it is a group III nitride compound semiconductor which can be expressed as a general formula of AlGaInN. Even more particularly, as a group V element, As or P may be contained.

The buffer layer 12 preferably has a composition containing Al, in particular, the composition is preferably GaAlN. In such a case, the composition preferably contains Al of not less than 50%.

In addition, since the buffer layer 12 can be efficiently a columnar crystalline aggregate, by constituting the buffer layer 12 from AlN, it is more preferable.

[Semiconductor Layer]

As shown in FIG. 1, the laminated semiconductor 10 in this embodiment consists of the substrate 1, and a nitride type compound semiconductor layer 20 laminated on the substrate 11 intervening the buffer layer 12 therebetween. The semiconductor layer 20 consists of the n-type semiconductor layer 14, the light-emitting layer 15 and the p-type semiconductor layer 16, and the n-type semiconductor layer 14 consists of a ground layer 14*a* and an n-type contact layer 14*b* consisting of a group m nitride compound semiconductor. The ground layer 14*a* is laminated onto the buffer layer 12.

As described in the above, on the ground layer 14*a* consisting of a group III nitride compound semiconductor, it is possible to form a crystal laminated structure having the function like the laminated semiconductor 10 shown in FIG. 1. For example, when a semiconductor laminated structure for a light emitting device is formed, it is possible to laminate an n-type conductive layer in which n-type dopant such as Si, Ge, Sn, etc. is doped or a p-type conductive layer in which p-type dopant such as Mg etc. is doped. In addition, as a material for a light-emitting device, InGaN can be used, and AlGaN can be used for a clad layer. In this way, by forming a group III nitride semiconductor crystal layer to which a further function is added, it is possible to produce a wafer having a semiconductor laminated structure which can be used to produce a light-emitting diode, a laser diode, or an electronic device, etc.

As a nitride type compound semiconductor, for example, many of the gallium nitride type compound semiconductors expressed by general formula: $Al_xGa_yIn_zN_{1-A}M_A$ ($0 \leq X 1$, $0 \leq Y \leq 1$, $0 \leq Z \leq 1$, and $X+Y+Z=1$, symbol M denotes an element of V group other than nitrogen (N), and $0 \leq A < 1$) are known well, and these well-known gallium nitride type compound semiconductors expressed by general formula: $Al_xGa_yIn_zN_{1-A}M_A$ ($0 \leq X \leq 1$, $0 \leq Y \leq 1$, $0 \leq Z \leq 1$, and $X+Y+Z=1$, element of V group other than nitrogen (N), and $0 \leq A < 1$) can be used in the present invention, without any limitations.

The gallium nitride type compound semiconductor may contain another group III element other than Al, Ga and In, and if necessary, an element such as Ge, Si, Mg, Ca, Zn, Be, P and As, etc. may be contained therein. In addition, not only elements intentionally added, but impurities necessarily contained depending on the film-forming method and a very small amount of impurities included in raw materials or ration pipe materials may be also contained therein.

"N-type Semiconductor Layer"

The n-type semiconductor layer 14 is usually laminated on the buffer layer 12, consisting of the ground layer 14*a*, n-type contact layer 14*b* and the n-type clad layer 14*c*. It should be noted that the n-type contact layer can double as a ground layer and/or an n-type clad layer, whereas the ground layer can double as an n-type contact layer, and/or an n-type clad layer.

(Ground Layer)

The ground layer 14*a* of this embodiment consists of a group III nitride compound semiconductor. It is not always necessary for the material of the ground layer 14*a* to be the same as the buffer layer 12 formed on the substrate 11, and materials different therefrom may be used; however, the material is preferably constituted from an $Al_xGa_{1-x}N$ layer ($0 \leq x \leq 1$, preferably $0 \leq x \leq 0.5$, more preferably $0 \leq x \leq 0.1$). In addition, the inventors of the present invention have performed an experiment to reveal that a group III nitride compound containing Ga, i.e. a GaN type compound semiconductor is preferable as a material for use in the ground layer 14*a*.

If necessary, the ground layer 14*a* may be either doped with n-type impurities ranging from $1 \times 10^{17}$ to $1 \times 10^{19}/cm^3$, or undoped state ($<1 \times 10^{17}/cm^3$), and the undoped state is preferable because of the maintenance of excellent crystallinity.

When the substrate 11 is electrically conductive, an electrode can be formed on and below a light-emitting device by doping a dopant into the ground layer 14*a* to be electrically conductive. On the other hand, when an insulating material is used for the substrate 11, both a positive electrode and a negative electrode are disposed on the same surface of a light-emitting device. Hence, the ground layer 14a is preferably a crystal without doping, because the crystallinity becomes excellent.

Although the n-type impurities are not limited particularly, Si, Ge and Sn are exemplary, and Si and Ge are preferable.

(N-type Contact Layer)

The n-type contact layer 14b of this embodiment consists of a group III nitride compound semiconductor.

The n-type contact layer 14b is preferably constituted from an $Al_xGa_{1-x}N$ layer ($0 \leq x \leq 1$, preferably $0 \leq x \leq 0.5$, and more preferably $0 \leq x \leq 0.1$) similarly to the ground layer 14a. In addition, an n-type impurity is preferably doped thereinto, and an n-type impurity ranging from $1 \times 10^{17}$ to $1 \times 10^{19}/cm^3$, preferably ranging from $1 \times 10^{18}$ to $1 \times 10^{19}/cm^3$ is contained therein so as to maintain an excellent ohmic contact with a negative electrode to control the generation of crack and to maintain excellent crystallinity. Although, the n-type impurities are not limited particularly, Si, Ge and Sn are exemplary, and Si and Ge are preferable. In addition, as described above, the n-type contact layer 14b may double as a ground layer.

Preferably the ground layer 14a and a gallium nitride type compound semiconductor serving as a n-type contact layer 14b have the same composition, and the total thickness of these ranges from 0.1 to 20 μm, preferably from 0.5 to 15 μm, and more preferably from 1 to 12 μm. If the thickness is within this range, then the excellent crystallinity of the semiconductor can be maintained.

(N-type Clad Layer)

An n-type clad layer 14c is preferably disposed between the n-type contact layer 14b and a light emitting layer 15 described later. The n-type clad layer 14c may be equipped with effects such as the supply of electron to a light emitting layer 15 described later, the moderation of difference in lattice constant, etc. The n-type clad layer 14c can be formed by using AlGaN, GaN and GaInN, in addition, the n-type clad layer 14c may be either a heterojunction of these constructions or a superstructure formed by laminating two or more times. When the n-type clad layer 14c is formed from GaInN, it is preferable to allow it to be larger than the bandgap of GaInN of the light emitting layer 15 in order to prevent reabsorption of the emission of light.

An n-type doping concentration of the n-type clad layer 14c preferably ranges from $1 \times 10^{17}$ to $1 \times 10^{20}/cm^3$, more preferably from $1 \times 10^{18}$ to $1 \times 10^{19}/cm^3$. If the doping concentration is within this range, then it is preferable in order to maintain the excellent crystallinity and to reduce the working voltage of the light emitting device.

"P-type Semiconductor Layer"

A p-type semiconductor layer 16 is usually constituted from a p-type clad layer 16a and a p-type contact layer 16b. In addition, a p-type contact layer may double as a p-type clad layer.

(P-type Clad Layer)

The p-type clad layer 16a is not particularly limited, as long as it has a composition which will be larger than the band gap energy of the light emitting layer 15 of which detail will be given later, being capable of enclosing a carrier into the light emitting layer 15, preferably those consisting of $Al_dGa_{1-d}N$ ($0 < d \leq 0.4$, preferably $0.1 \leq d \leq 0.3$) are exemplary. If the p-type clad layer 16a consists of such an AlGaN, then it is preferable for enclosing a carrier into the light emitting layer 15.

A p-type doping concentration of the p-type clad layer 16a preferably ranges from $1 \times 10^{18}$ to $1 \times 10^{21}/cm^3$, and more preferably from $1 \times 10^{19}$ to $1 \times 10^{20}/cm^3$. If the p-type doping concentration is within this range, then an excellent p-type crystal is obtained without deteriorating crystallinity.

(P-type Contact Layer)

Preferably, the p-type contact layer 16b is a gallium nitride type compound semiconductor layer containing at least an $Al_eGa_{1-e}N$ ($0 \leq e < 0.5$, preferably $0 \leq e \leq 0.2$, and more preferably $0 \leq e \leq 0.1$). If an Al composition is within the range, then it is preferable for maintaining an excellent crystallinity and forming an excellent Ohmic contact with a p ohmic electrode (cf. a transparent electrode 17 described later). In addition, if the p-type dopant is contained at a concentration ranging from $1 \times 10^{18}$ to $1 \times 10^{21}/cm^3$, then it is preferable for maintaining excellent Ohmic contact, preventing the generation of cracks, and maintaining excellent crystallinity, and more preferably it ranges from $5 \times 10^{19}$ to $5 \times 10^{20}/cm^3$. Although the p-type impurities are not limited particularly, for example, Mg is preferable.

"Light Emitting Layer"

The light emitting layer 15 is a layer which is laminated onto the n-type semiconductor layer 14, and a layer on which the p-type semiconductor layer 16 is laminated. The light emitting layer 15 may have any of a multiplex quantum well structure, a single well structure, and a bulk structure. In the example shown in FIG. 1, the light emitting layer 15 has a multiplex quantum well structure, in which each of six barrier layers 15a and five well layers 15b is laminated alternately and repeatedly so that the barrier layer 15a is arranged at both the top-end layer and the bottom-end layer, while inserting each the well layer 15b between the barrier layer 15a, respectively.

As the barrier layer 15a, for example, a gallium nitride type compound semiconductor having a band gap energy larger than the well layer 15b consisting of a gallium nitride type compound semiconductor containing indium is preferably used. In addition, as the well layer 15b, for example, a gallium nitride indium such as $Ga_{1-s}In_sN$ ($0 < s < 0.4$) as a gallium nitride type compound semiconductor containing indium can be used.

<Transparent Positive Electrode>

The transparent positive electrode 17 is a transparent electrode formed on a p-type semiconductor layer 16 of the laminated semiconductor 10 produced as in the above. Material for the transparent positive electrode 17 is not particularly limited, and materials such as ITO ($In_2O_3$—$SnO_2$), AZO (ZnO—$Al_2O_3$), IZO ($In_2O_3$—ZnO), and GZO (ZnO—$Ga_2O_3$) can be used through a general means known well in this technological field. In addition, the structure may be any structure including conventionally known well structures without any limitations.

The transparent positive electrode 17 may be formed either to cover substantially the whole surface of the p-type semiconductor layer 16 of Mg dope or to be a lattice shape or branching shape by leaving space therebetween. Although a heat annealing for the purpose of alloying or performing rarefaction may be performed after the transparent positive electrode 17 is formed, the heat annealing may not be performed.

<Positive Electrode Bonding Pad and Negative Electrode>

A positive electrode bonding pad 18 is an electrode formed on the transparent positive electrode 17. As the material for the positive electrode bonding pad 18, various structures using Au, Al, Ni and Cu are well-known, and any material or structure of these may be used without any limitations. The thickness of the positive electrode bonding pad 18 preferably ranges from 100 to 1000 nm. In addition, the larger the thickness of the bonding pad is, the higher the bondability becomes. Hence, the thickness of the positive boding pad 18 is more preferably not less than 300 nm. In addition, the thickness of the positive boding pad 18 is preferably not more than 500 nm from the viewpoint of production cost.

The negative electrode 19 is formed so as to be in contact with the n-type contact layer 14*b* of the n-type semiconductor layer 14, in the semiconductor layer consisting of the substrate 11, and the n-type semiconductor layer 14, the light emitting layer 15 and the p-type semiconductor layer 16 are laminated onto the substrate sequentially. Thus, when forming the negative electrode 19, the p-type semiconductor layer 16, the light emitting layer 15 and a part of the n-type semiconductor layer 14 are removed, and an exposed domain 14*d* of the n-type contact layer 14*b* is formed. The negative electrode 19 is formed thereon.

As the material for the negative electrode 19, negative electrodes of various composition and structure are well-known, and these well-known negative electrodes may be used without any limitation. The negative electrode can be provided through well-known means in this technological field.

In accordance with the process for producing a group III nitride compound semiconductor light emitting device 1 of this embodiment described in the above, doping can be easily performed into a p-type semiconductor layer 16 as well as adjusting the doping amount by disposing the Ga target 47*a* consisting of Ga element serving as a main composition of a mixture crystal and the AlMg target 47*b* consisting of a mixture of an element serving as a sub-component of a mixture crystal with a dopant element (Mg) in the sputtering apparatus(the chamber 41) and simultaneously sputtering the Ga target 47*a* and the AlMg target 47*b*. By this, the mixing balance between the composition of a target material containing Ga element and a dopant can be optimized. In addition, it becomes possible to shorten the process time for forming the p-type semiconductor layer 16 and simplifying the constitution of the production apparatus.

Thus, it is possible to efficiently grow a semiconductor layer consisting of a group III nitride compound having excellent crystallinity, thereby providing a group III nitride compound semiconductor light emitting device which excels in productivity, having a low cost and excellent light emitting characteristics.

[Lamp]

A lamp can be constituted through a method known well to persons skilled in the art by combining the group III nitride compound semiconductor light emitting device of the present invention explained in the above with a fluorescent substance. Hitherto, a technique of changing emission color by combining a light emitting device with a fluorescent substance has been known, and these techniques can be used without any limitations.

For example, it becomes possible to provide a light emission having a wavelength larger than a light emitting device by properly selecting a fluorescent substance, and further, it is also possible to provide a lamp which can emit white light by mixing a light emitting wavelength of the light emitting device itself and a wavelength converted by a fluorescent substance.

In addition, the lamp may be used any use of a cannonball shape for a general purpose, a side-view type for use in a backlight of a mobile phone, and a top-view type for use in a displaying apparatus.

Figure 4:
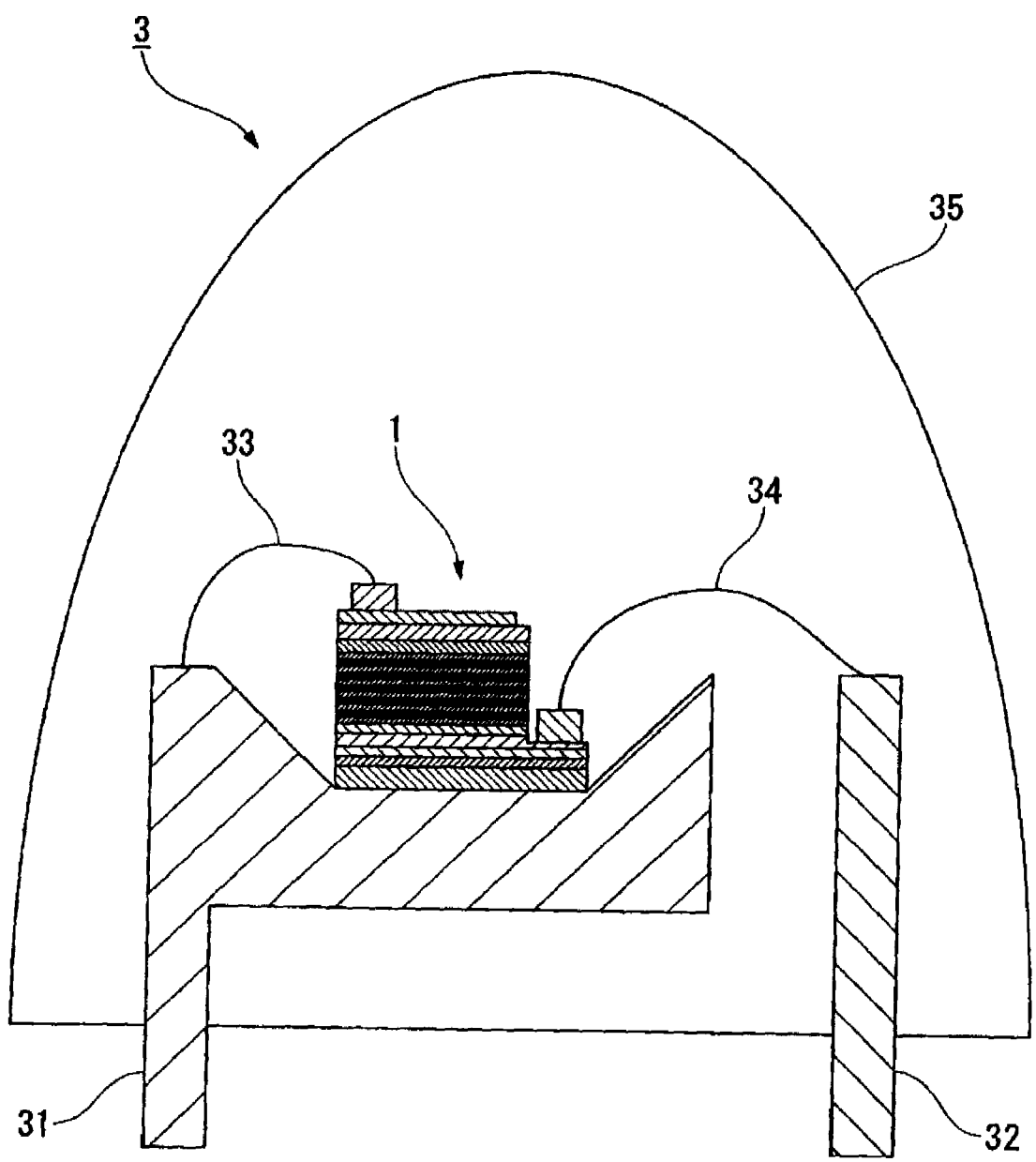
FIG. 4 is a schematic view showing a lamp using a group III nitride compound semiconductor light emitting device of the present invention.

For example, as shown in FIG. 4, when the group III nitride compound semiconductor light emitting device 1 of the same surface electrode type is mounted into a bullet shape lamp, the light emitting device I is bonded to one of two frames (frame 31 in FIG. 4), and a negative electrode of the light emitting device 1 (cf. symbol 19 shown in FIG. 3) is connected to the frame 32 through a wire 34. A positive electrode bonding bad (cf. symbol 18 shown in FIG. 3) is connected to the frame 31 rough a wire 33. Also, a lamp 3 having a bullet shape as shown in FIG. 4 can be produced by molding the circumference of the light emitting device 1 with a mold resin 35 consisting of a transparent resin.

In addition, the group III nitride compound semiconductor light emitting device of the present invention can be used for photoelectricity conversion device such as a laser device or photo acceptance device or electronic devices such as HBT or HEMT in addition to the light emitting device. A lot of semiconductor devices having various structures like this are known well, and the device structure of a laminated structure of the group III nitride compound semiconductor light emitting device of the present invention can include these well-known device structure, without any limitations.

EXAMPLE

Next, the process for producing a group III nitride compound semiconductor light emitting device of the present invention will be explained in detail below, referring to examples; however, the present invention is not limited to only these examples.

Example 1

FIG. 1 is a schematic view showing a sectional structure of a laminated semiconductor of a group III nitride compound semiconductor light emitting device produced in this Example.

In this example, an aggregate of a columnar crystal consisting of AlN was formed on a c surface of the substrate 11 consisting of sapphire, as the buffer layer 12 using an RF sputtering method. Each of the ground layer 14*a* and the n-type contact layer 14*b* was formed as the n-type semiconductor layer 14 thereon using an RF sputtering method, and the n-type clad layer 14*c* was formed onto the n-type contact layer 14*b* using a MOCVD method. Also, the light emitting layer 15 was formed thereon using a MOCVD method, and then each of the p-type clad layer 16*a* and the p-type contact layer 16*b* was laminated in this order as the p-type semiconductor layer 16 onto the light emitting layer 15 using a sputtering method.

At first, the substrate 11 consisting of sapphire only one surface of which has been mirror finished so as to be used in an epitaxial growth was introduced into a sputtering apparatus without performing any pre-treatments such as wet-treatment particularly. Here, as the sputtering apparatus, an apparatus having a high frequency-type power supply, and a mechanism capable of moving a position of a magnet within a target was used.

The substrate 11 was heated to 750° C. in the sputtering apparatus, only nitrogen gas was introduced at a flow rate of 15 sccm thereinto, and thereafter the pressure in the chamber was maintained at 0.08 Pa, a high frequency bias of 50 W was applied to the substrate 11 side, and exposed to a nitrogen plasma, thereby cleaning the surface of the substrate 11.

Subsequently, after Ar gas and nitrogen gas were introduced into the sputtering apparatus, the temperature of the substrate 11 was decreased to 500° C. Under the condition of not applying bias to the substrate 11 side, a power of 1 W/cm$^2$ was applied to the metal Al target side, the pressure in the furnace was maintained at 0.5 Pa, and Ar gas was circulated at a flow rate of 5 sccm, and nitrogen gas was circulated at a flow rate of 15 sccm (nitrogen ratio in the total gas was 75%). The buffer layer 12 was formed on the substrate 11 consisting of sapphire. The magnet in the target was rotated both during the timing of cleaning of the substrate 11 and during film-formation. After performing a treatment for a specified period of time in accordance with a film-forming rate (0.12 nm/s) previously measured, an AlN (the buffer layer 12) having a thickness of 50 nm was formed, and thereafter plasma operation was stopped to decrease the temperature of the substrate 11.

Subsequently, the substrate 11 on which the buffer layer 12 was formed was taken out off the sputtering apparatus, and was conveyed to a different sputtering apparatus, and then a test sample on which GaN layer (a group III nitride semiconductor) was formed was produced by the following procedure using a sputtering method. Here, as a sputtering apparatus for forming a GaN layer, an apparatus having a high frequency type power supply, and a mechanism being capable of moving the position where electric field is applied to by sweeping a magnet within a Ga target having a square shape was used. In addition, piping for circulating refrigerants were equipped in the Ga target, and refrigerant cooled to 20° C. was circulated therein to prevent the fusion of Ga by heat.

First, after Ar gas and nitrogen gas were introduced into the chamber 41, the heater base 44 was heated by a beating means not shown in the drawings to elevate the temperature of the substrate 11 to 1000° C. Under the conditions the electric current was supplied to the heater base 44 to apply a high frequency bias of 0.5 W/cm$^2$ to the substrate 11 side and a power of 1 W/cm$^2$ was applied to the Ga target 47a, the pressure in the chamber was maintained at 0.5 Pa, Ar gas was circulated at a flow rate of 5 sccm, and nitrogen gas was circulated at a flow rate of 15 sccm (nitrogen ratio in the total gas was 75%), a layer consisting of GaN was formed onto the substrate 11 consisting of sapphire (onto the buffer layer 12). The growing rate in this case was approximately 1 nm/s. After a GaN layer having a thickness of 6 μm was formed, excited plasma was stopped.

Subsequently, a Si doped GaN layer having an electronic concentration of $1 \times 10^{19}$ cm$^{-3}$ and a thickness of 2 μm was formed under the same conditions. Using the same condition for forming film as in the undoped GaN layer, toward a Si target not shown in the drawings installed in the chamber 41, ions emitted from an ion gun were irradiated to remove Si, thereby doping Si.

By such a process, a test sample consisting of the substrate 11 consisting of sapphire, the buffer layer 12 having a columnar structure and consisting of AlN formed onto the substrate 11, a GaN layer (the ground layer 14a) which is undoped and has a thickness of 6 μm, and a Si doped GaN layer (the n-type contact layer 14b) having an electronic concentration of $1 \times 10^{19}$ cm$^{-3}$ and a thickness of 2 μm formed thereon was prepared. This test sample presented a mirror-like, colorless and transparent appearance.

This sample was introduced into a MOCVD furnace to form the n-type clad layer 14c and the light emitting layer 15 thereon. At first, an In$_{0.1}$Ga$_{0.9}$N type clad layer (the n-type clad layer 14c) having an electronic concentration of $1 \times 10^{18}$ cm$^{-3}$ and a thickness of 20 nm was formed onto the n-type contact layer 14b thus formed. The light emitting layer (multiple quantum well structure) 15 which is a laminated structure consisting of a GaN barrier layer at a first position and a GaN barrier layer at last, in which each of six barrier layers 5a consisting of GaN having a thickness of 16 nm and five well layers 15b consisting of non-doped In$_{0.2}$Ga$_{0.8}$N having a thickness of 3 nm were laminated alternately was formed thereon.

In order to form the p-type semiconductor layer 16 further onto a sample consisting of the substrate 11, the buffer layer 12, the n-type semiconductor layer 14 and the light emitting layer 15 laminated onto the substrate 11 in this order, the sample was introduced into a sputtering apparatus, as shown in FIG. 5, which is equipped with a high frequency power supply 48. A constitution such that the Ga target 47a consisting of Ga and the AlMg target 47b consisting of a mixture of Al serving as a sub-composition of the semiconductor layer with Mg serving as a dopant element can be disposed onto electrodes 43a and 43b for exciting plasma respectively within the chamber 41.

By simultaneously supplying a power to both the Ga target 47a and the AlMg target 47b, at first the p-type clad layer 16a consisting of Al$_{0.1}$Ga$_{0.9}$N in which 5 nm of Mg was doped was formed on the light emitting layer 15, and then the p-type contact layer 16b consisting of an Mg doped Al$_{0.02}$Ga$_{0.98}$N having a thickness of 200 nm was formed thereon to form the p-type semiconductor layer 16. Here, the p-type contact layer 16b consisting of Mg doped Al$_{0.02}$Ga$_{0.98}$N exhibited p-type characteristics even if no annealing treatment for activating p-type carriers was performed thereon. Through such a process, an epitaxial wafer (the laminated semiconductor 10) having an epitaxial laminar structure for use in a group III nitride compound semiconductor light emitting device as shown in FIG. 1 was finally produced.

Subsequently, using an epitaxial wafer (cf. the laminated semiconductor 10 in FIG. 1) produced by the process described above, a light emitting diode which is a kind of semiconductor light emitting device was produced (cf. the light emitting device 1 in FIGS. 2 and 3). At first, the produced wafer (the laminated semiconductor 10) was subjected to well-known photolithography to form a transparent positive electrode 17 consisting of ITO on the surface of the p-type contact layer 16b consisting of a Mg doped Al$_{0.02}$Ga$_{0.98}$N and a positive electrode bonding pad 18 consisting of titanium, aluminum and gold laminated in this order onto the surface of the transparent positive electrode thereon. In addition, dry etching was performed on a part of the wafer to expose an exposed domain 14d on the n-type contact layer 14b, and a negative electrode 19 consisting of four layers including Ni, Al, Ti and Au was formed onto this part.

By these processes, each electrode having the shape as shown in FIGS. 2 and 3 was produced on the wafer.

With respect to the wafer in which an electrode was formed on both the p-type semiconductor layer 14 and the n-type semiconductor layer 16, the back surface of the substrate 11 was ground and polished to be a mirror surface and was cut into a chip of square of side 350 nm. The resultant chip was placed onto a lead frame so that each electrode was arranged top side, and each electrode was connected to the lead frame through a gold wire to obtain a semiconductor light emitting device. When a forward current flowed between the positive electrode bonding pad 18 and the negative electrode 19 of the semiconductor device (light emitting diode), the forward voltage at a current of 20 mA was 3.0 V.

In addition, an emission of light wavelength was 460 nm, and the emission of light output was 15 mW when an emission of light state was observed through the transparent positive electrode 17 at the p-type semiconductor layer 16 side.

Such a light emitting characteristic of a light emitting diode was obtained without unevenness from the light emitting diode produced from substantially the whole surface of a wafer.

Comparative Example 1

In his example, similarly to Example 1, with the exception of using an apparatus S which is equipped with a sputtering target produced by mixing Ga, Al and Mg in the same target as an apparatus used for forming the p-type semiconductor layer 16, a buffer layer consisting of an aggregate of columnar crystal consisting of AlN was formed onto the c surface of the substrate consisting of sapphire by a sputtering method. A ground layer and an n-type contact layer were formed thereon by a sputtering method, and an n-type clad layer was formed thereon using a MOCVD method Thereafter the light emitting layer 15 was formed onto the n-type clad layer using a MOCVD method, and further a p-type clad layer and a p-type contact layer were formed in this order thereon using a sputtering method. When the wafer was taken out from the reacting apparatus, it was confirmed that the surface of the wafer was a mirror surface.

Similar to Example 1, a transparent positive electrode consisting of ITO was formed onto the wafer produced in this way, and further a positive electrode bonding pad and a negative electrode were formed. Thereafter, the back surface of the substrate was ground and polished to be a mirror surface and the wafer was cut into a chip of square of side 350 µm. The resultant chip was placed on a lead frame such that each electrode was arranged upper side, and the electrode was connected to the lead frame through a gold wire to form a semiconductor light emitting device.

When a forward current flowed between the positive electrode bonding pad and the negative electrode of the light emitting device (light emitting diode) in Comparative Example 1, the forward voltage at a current of 20 mA was 3.1 V.

In addition, the wavelength of an emission of light was 470 nm, and output of the emission of light was 14.5 mW, when the state of an emission of light was observed through the transparent positive electrode at the layer side of the p-type semiconductor. Such a light emitting characteristic of a light emitting diode was obtained without unevenness from the light emitting diode produced from substantially the whole surface of a wafer.

The light emitting device of Comparative Example 1 was not significantly inferior to the light emitting device of Example 1 with respect to light emitting characteristics, however, when 643 pieces of wafer having the same construction were produced by the method of Comparative Example 1 above, the doping amount was not stable, and 32 pieces of the 643 pieces of wafer had a fault in that the forward voltage Vf was high. Therefore, it revealed that the method of Comparative Example 1 was inferior in the yield to the production process of light emitting devices of Example 1.

Comparative Example 2

In this example, a wafer (laminated semiconductor) was produced similarly to Example 1, with the exception of forming the p-type semiconductor layer 16 using a MOCVD apparatus. When the wafer was taken out from the reacting apparatus, it was confirmed that the surface of the wafer was a mirror surface.

Similar to Example 1, a transparent positive electrode was formed on the wafer produced in this way, and further a positive electrode bonding pad and a negative electrode were formed, and thereafter the back surface of the substrate was ground and polished to be a mirror surface and the wafer was cut into a chip of square of side 350 µm, the resultant chip was placed on a lead frame such that each electrode was arranged upper side, and the electrode was connected to the lead frame through a gold wire to form a semiconductor light emitting device.

When a forward current flowed between the positive electrode bonding pad and the negative electrode of the light emitting device (light emitting diode) in Comparative Example 2, the forward voltage at a current of 20 mA was 3.4 V. In addition, an emission of light wavelength was 460 nm, and the emission of light output was 14.5 mW, when an emission of light state was observed trough the transparent positive electrode at the p-type semiconductor layer side. Such a light emitting characteristic of a light emitting diode was obtained without unevenness from the light emitting diode produced from substantially the whole surface of a wafer.

The light emitting device of Comparative Example 2 was not significantly inferior to the light emitting device of Example 1 with respect to light emitting characteristics, however, since the method in Comparative Example 2 used a MOCVD apparatus which was massive and expensive, it occupied the process space and a lot of man-hours for maintenance. Therefore, the experiment revealed that the production cost becomes higher than that of the light emitting device produced by the production process of Example 1, and that the difference in the cost will be larger in the case in which the light emitting device is mass-produced by the method of Comparative Example 2.

From the above results, it is clear that the group III nitride compound semiconductor light emitting device of the present invention excels in productivity and light emitting characteristics.

While preferred embodiments of the invention have been described and illustrated above, it should be understood that these are exemplary of the invention and are not to be considered as limiting.

Additions, omissions, substitutions, and other modifications can be made without departing from the spirit or scope of the present invention. Accordingly, the invention is not to be considered as being limited by the foregoing description, and is only limited by the scope of the appended claims.

In accordance with the process for producing a group III nitride compound semiconductor light emitting device of the present invention, a mixed target consisting of an element serving as a sub-composition of a mixed crystal and a dopant element, and a target consisting of Ga element serving as a main composition of a mixed crystal are disposed respectively. These targets are sputtered simultaneously, thereby it becomes easy to dope into the semiconductor layer and to adjust doping amount. By this, it is possible to optimize the mixing balance between the composition of a target material containing Ga element and a dopant.

In addition, the process time when forming a semiconductor layer can be shortened and the apparatus can be simplified. Thus, a group III nitride compound semiconductor light emitting device being capable of growing a semiconductor layer consisting of a group III nitride compound having excellent crystallinity at a high efficiency, having a low production cost, and excellent light emitting characteristics is provided.

The group III nitride compound semiconductor light emitting device obtainable from the present invention has a surface layer consisting of a group III nitride compound semiconductor crystal having an excellent crystallinity. Accordingly, it is possible to produce a semiconductor device such as a light emitting diode, a laser diode, and an electronic device, having excellent light emitting characteristics.

What is claimed is:

1. A process for producing a group III nitride semiconductor light emitting device having a semiconductor layer constituted by laminating an n-type semiconductor layer, a light-emitting layer and a p-type semiconductor layer, each of which consisting of a group III nitride semiconductor, comprising a step of forming at least a part of the semiconductor layer by a sputtering method, wherein upon forming the p-type semiconductor layer by a sputtering method, a Ga target containing Ga element, and a dopant target consisting of a mixture of an element having a small crystal composition of elements contained in the p-type semiconductor layer and a dopant element is used as a sputtering target, and power is applied simultaneously to both the Ga target and the dopant target.

2. The process for producing a group III nitride semiconductor light emitting device as set forth in claim 1, wherein the dopant element is Mg, and the element having a small crystal composition is Al.

3. The process for producing a group III nitride semiconductor light emitting device as set forth in claim 1, wherein the power applied to the target upon forming the p-type semiconductor layer is applied by a high frequency method or a pulse DC method.

4. The process for producing a group III nitride semiconductor light emitting device as set forth in claim 1, wherein upon forming the p-type semiconductor layer, a magnetic field is rotated or swung to the sputtering target.

5. The process for producing a group III nitride semiconductor light emitting device as set forth in claim 1, wherein the forming of the p-type semiconductor layer is performed by a reactive sputtering method to flow a nitride raw material in a reactor.

6. The process for producing a group III nitride semiconductor light emitting device as set forth in claim 5, wherein the nitride raw material is nitrogen.

7. The process for producing a group III nitride semiconductor light emitting device as set forth in claim 1, wherein the semiconductor layer is formed on a buffer layer consisting of columnar crystal which is formed on a substrate before the semiconductor layer is formed.

8. The process for producing a group III nitride semiconductor light emitting device as set forth in claim 7, wherein the buffer layer consists of a group III nitride compound containing Al as a group III element.

9. The process for producing a group III nitride semiconductor light emitting device as set forth in claim 8, wherein the buffer layer consists of AlN.

10. The process for producing a group III nitride semiconductor light emitting device as set forth in claim 7, wherein the buffer layer is formed so as to cover at least 90% of the surface of the substrate.

11. The process for producing a group III nitride semiconductor light emitting device as set forth in claim 7, wherein the columnar crystal constituting the buffer layer has a grain ranging from 0.1 to 100 nm.

12. The process for producing a group III nitride semiconductor light emitting device as set forth in claim 7, wherein the buffer layer has a thickness ranging from 10 to 500 nm.

13. The process for producing a group III nitride semiconductor light emitting device as set forth in claim 7, wherein the substrate consists of sapphire.

* * * * *